US009865552B2

(12) United States Patent
Ryu et al.

(10) Patent No.: US 9,865,552 B2
(45) Date of Patent: Jan. 9, 2018

(54) WAFER LEVEL PACKAGE

(71) Applicant: Samsung Electronics Co., Ltd., Suwon-si, Gyeonggi-do (KR)

(72) Inventors: Han-Sung Ryu, Seoul (KR); Kyong-soon Cho, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/002,749

(22) Filed: Jan. 21, 2016

(65) Prior Publication Data

US 2016/0365319 A1    Dec. 15, 2016

(30) Foreign Application Priority Data

Jun. 11, 2015  (KR) .................. 10-2015-0082569

(51) Int. Cl.
*H01L 23/00* (2006.01)
*H01L 23/29* (2006.01)
*H01L 21/56* (2006.01)
*H01L 23/31* (2006.01)

(52) U.S. Cl.
CPC .......... *H01L 23/562* (2013.01); *H01L 21/561* (2013.01); *H01L 21/565* (2013.01); *H01L 23/3114* (2013.01)

(58) Field of Classification Search
CPC ..... H01L 23/562; H01L 23/295; H01L 23/00; H01L 23/29; H01L 21/565; H01L 23/3114; H01L 23/28; H01L 24/94; H01L 25/0655
USPC .......................... 257/795, 723, 686, 685, 728
See application file for complete search history.

(56) References Cited

U.S. PATENT DOCUMENTS

| 7,608,481 B2 | 10/2009 | Masuda |
| 8,012,867 B2 | 9/2011 | Lee et al. |
| 8,421,211 B2 | 4/2013 | Kang et al. |
| 8,563,350 B2 | 10/2013 | Tu et al. |
| 8,610,286 B2 | 12/2013 | Lin et al. |
| 8,975,736 B2 | 3/2015 | Okuno et al. |
| 9,337,096 B2 * | 5/2016 | Wang ............... H01L 25/0655 |
| 9,343,432 B2 * | 5/2016 | Lee .................... H01L 23/3128 |
| 9,391,049 B2 * | 7/2016 | Lin ..................... H01L 25/50 |
| 9,548,273 B2 * | 1/2017 | Gao ................. H01L 23/49827 |
| 2008/0179711 A1 | 7/2008 | Fujimoto et al. |
| 2010/0190294 A1 | 7/2010 | Simmons-Matthews |
| 2011/0221053 A1 | 9/2011 | Chandrasekaran et al. |
| 2012/0244664 A1 | 9/2012 | Jin et al. |
| 2012/0274868 A1 * | 11/2012 | Cho .................. G02F 1/133 349/33 |
| 2013/0256866 A1 | 10/2013 | Dahilig et al. |
| 2015/0001685 A1 * | 1/2015 | Chung ............... H01L 21/486 257/621 |

(Continued)

FOREIGN PATENT DOCUMENTS

| KR | 10-1030381 B1 | 4/2011 |
| WO | WO-2015/013024 A1 | 1/2015 |

*Primary Examiner* — Alexander Oscar Williams
(74) *Attorney, Agent, or Firm* — Harness, Dickey & Pierce, P.L.C.

(57) ABSTRACT

A wafer level package includes a substrate, a plurality of semiconductor chips mounted on the substrate, and molding members that contact the substrate and the plurality of semiconductor chips and are formed on the substrate. The molding members include two or more molding members that have coefficients of thermal expansion (CTEs) different from each other.

15 Claims, 21 Drawing Sheets

(56) References Cited

U.S. PATENT DOCUMENTS

| | | |
|---|---|---|
| 2015/0014864 A1 | 1/2015 | Chen et al. |
| 2015/0093858 A1* | 4/2015 | Hwang .................. H01L 24/96 438/113 |
| 2016/0027754 A1* | 1/2016 | Katagiri ............ H01L 23/49816 257/737 |
| 2017/0011992 A1* | 1/2017 | Kim .................. H01L 23/49838 |

* cited by examiner

A-A'

(1)

(2)

A-A'

(1)

(2)

A-A'

A-A'

A-A'

A-A'

A-A'

WAFER LEVEL PACKAGE

CROSS-REFERENCE TO RELATED APPLICATION

This application claims the benefit of Korean Patent Application No. 10-2015-0082569, filed on Jun. 11, 2015, in the Korean Intellectual Property Office, the disclosure of which is incorporated herein in its entirety by reference.

BACKGROUND

The inventive concepts relate to a wafer level package, and more particularly, to a wafer level package that includes dissimilar molding members having different coefficients of thermal expansion (CTEs) with respect to a plurality of semiconductor chips mounted on a substrate.

Even though volumes of electronic devices decrease, a large capacity of data is processed by the electronic devices. Accordingly, the degree of integration of semiconductor devices used in such electronic devices increases. Particularly, recently, a semiconductor package process for reducing the size of a wafer level package to that of a semiconductor chip while maintaining characteristics of a bare chip is being researched and developed. However, since warpage occurs in the wafer level package due to a difference between coefficients of thermal expansion (CTEs) of a substrate and a molding member, it may be difficult to meet expectations with regard to chucking for a processing facility. Such a problem is serious in the processing of large-diameter wafers, which is a current trend in producing wafer level packages.

SUMMARY

At least some of the inventive concepts provide a wafer level package in which warpage is easily controlled, by forming dissimilar molding members having different coefficients of thermal expansion (CTEs) with respect to a plurality of semiconductor chips mounted on a substrate.

According to an aspect of the inventive concepts, a wafer level package may include a substrate a plurality of semiconductor chips mounted on the substrate and molding members that contact the substrate and the plurality of semiconductor chips and are disposed on the substrate. The molding members may include two or more molding members that have coefficients of thermal expansion (CTEs) different from each other.

The molding members may include a first molding member and a second molding member that have CTEs different from each other, the CTE of the first molding member may be greater than a CTE of the substrate, and the CTE of the substrate may be greater than the CTE of the second molding member.

The molding members may include a first molding member and a second molding member that have CTEs different from each other, the CTE of the second molding member may be greater than a CTE of the substrate, and the CTE of the substrate may be greater than the CTE of the first molding member.

Top surfaces of the molding members may be at a same level as top surfaces of the plurality of semiconductor chips with respect to a top surface of the substrate, and the molding members may expose the top surfaces of the plurality of semiconductor chips.

Top surfaces of the molding members may be at a higher level than top surfaces of the plurality of semiconductor chips with respect to a top surface of the substrate, and the molding members may cover the top surfaces of the plurality of semiconductor chips.

The molding members may include a first molding member and a second molding member that have CTEs different from each other, at least one of the plurality of semiconductor chips may be surrounded only by the first molding member, and remaining ones of the plurality of semiconductor chips may be surrounded by the first molding member and the second molding member.

The molding members may include a first molding member and a second molding member that have CTEs different from each other, the first molding member may surround at least sides of the plurality of semiconductor chips, and the second molding member may surround the first molding member.

A top surface of the first molding member may be at a same level as top surfaces of the plurality of semiconductor chips with respect to a top surface of the substrate.

The first molding member may cover the plurality of semiconductor chips.

The substrate may be warped in a form of a wave.

According to another aspect of the inventive concepts, there is provided a semiconductor chip having atop surface, a bottom surface, and at least four sides; a first molding member that covers at least one side of the semiconductor chip; and a second molding member that covers sides of the semiconductor chip which are not covered with the first molding member, wherein coefficients of thermal expansion (CTEs) of the first molding member and the second molding member are different from each other.

The first molding member may cover one side from among the at least four sides of the semiconductor chip, and the second molding member may cover the sides of the semiconductor chip which are not covered with the first molding member.

The first molding member may cover two adjacent sides from among the at least four sides of the semiconductor chip, and the second molding member covers the sides of the semiconductor chip which are not covered with the first molding member.

The first molding member and the second molding member may cover the at least four sides of the semiconductor chip, and the top surface and the bottom surface of the semiconductor chip may not be covered with the first molding member and the second molding member.

The first molding member and the second molding member may cover the at least four sides of the semiconductor chip, the first molding member or the second molding member may cover the top surface of the semiconductor chip, and the bottom surface of the semiconductor chip may not be covered by the first molding member and the second molding member.

The first molding member and the second molding member may cover the at least four sides of the semiconductor chip, the first molding member or the second molding member may cover the top surface of the semiconductor chip, and the bottom surface of the semiconductor chip may not be covered by the first molding member and the second molding member.

According to an aspect of the inventive concepts, there is provided a wafer level package including: a substrate; a plurality of semiconductor chips mounted on the substrate; and a first molding member formed in an area in which the plurality of semiconductor chips face each other; and a second molding member formed in an area in which the plurality of semiconductor chips do not face each other, wherein coefficients of thermal expansion (CTEs) of the first molding member and the second molding member are different from each other.

The CTE of the first molding member may be greater than a CTE of the substrate, and the CTE of the substrate may be greater than the CTE of the second molding member.

The CTE of the second molding member may be greater than a CTE of the substrate, and the CTE of the substrate may be greater than the CTE of the first molding member.

A top surface of the first molding member, a top surface of the second molding member, and top surfaces of the plurality of semiconductor chips may be at a same level with respect to a top surface of the substrate, and the molding members may expose the top surfaces of the plurality of semiconductor chips.

At least one of the plurality of semiconductor chips may contact both the first molding member and the second molding member, and remaining ones of the plurality of semiconductor chips may contact only the first molding member.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
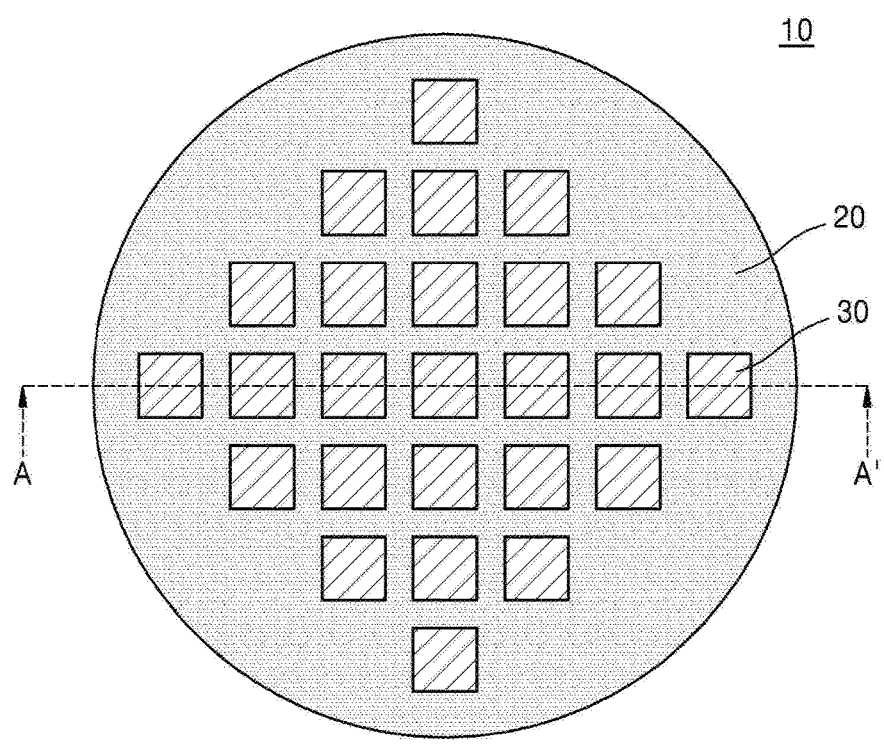
FIGS. 1A through 1C illustrate diagrams showing a wafer level package according to a comparative experimental example.

The attached drawings for illustrating example embodiments of the inventive concepts are referred to in order to gain a sufficient understanding of a structure and an effect of the inventive concepts. However, the present example embodiments may have different forms and should not be construed as being limited to the descriptions set forth herein. Accordingly, the example embodiments are merely described below, by referring to the figures, to explain aspects of the present description. The example embodiments are provided so that this disclosure will be thorough and complete, and will fully convey the concepts of the inventive concepts to those skilled in the art, and the scope of the inventive concepts should be defined by the appended claims. In the drawings, the lengths and sizes of components may be exaggerated for clarity.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" or "in contact with" another element, the element can be directly on or connected to another element or intervening elements. In contrast, when an element is referred to as being "directly on" or "in direct contact with" another element, there are no intervening elements present. Other words used to describe the relationship between should be interpreted in a like fashion "between," versus "directly between," etc.).

It will be understood that, although the terms first, second, etc. may be used herein to describe various components, these components should not be limited by these terms. These terms are only used to distinguish one component from another component. For example, a first component may be referred to as a second component, and similarly, a second component may be referred to as a first component without departing from the scope of protection.

An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless terms used in embodiments of the inventive concepts are defined differently, the terms may be construed as meaning known to those skilled in the art.

Unless otherwise described herein, a vertical direction or a horizontal direction refers to a vertical direction or a horizontal direction with respect to a main surface of a package substrate. Additionally, unless otherwise described herein, a top surface of a component stacked on a package substrate refers to an opposite surface with respect to the package substrate, and a bottom surface of the component refers to a surface that directs toward the package substrate.

Hereinafter, the inventive concepts will be described more fully with reference to the accompanying drawings, in which example embodiments of the inventive concepts are shown.

Figure 1B:
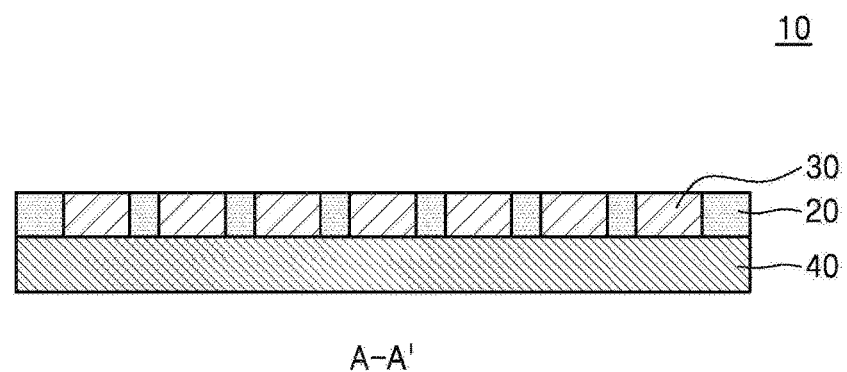
Figure 1C:
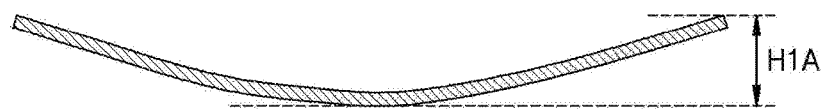
Figure 1C:
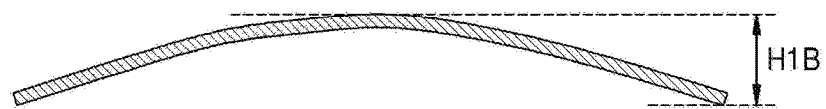

FIGS. 1A through 1C illustrate diagrams showing a wafer level package 10 according to a comparative experimental example. FIG. 1A is a plan view of the wafer level package 10. FIG. 1B is a cross-sectional view of the wafer level package 10, which is taken along line A-A of FIG. 1A. FIG. 1C is a mimetic diagram showing warpage of the wafer level package 10.

Referring to FIG. 1A, the wafer level package 10 may be manufactured by using a single molding member 20. The wafer level package 10 may include a plurality of semiconductor chips 30 mounted on a substrate 40 (shown in FIG. 1B), and a single molding member 20 that covers a part of a top surface of the substrate 40 (shown in FIG. 1B) and sides of the plurality of semiconductor chips 30. The whole top surface of the substrate 40 (shown in FIG. 1B) may be covered with the plurality of semiconductor chips 30 and the single molding member 20.

Referring to FIG. 1B, the wafer level package 10 may include the plurality of semiconductor chips 30 mounted on the substrate 40, and the single molding member 20 that is at a same level as top surfaces of the plurality of semiconductor chips 30. In a case where the wafer level package 10 has such a structure, a material of the substrate 40, a material of the single molding member 20, and a material of the plurality of semiconductor chips 30 may be different from each other, and the materials of the substrate 40, the single molding member 20 and the plurality of semiconductor chips 30 may have different coefficients of thermal expansion (CTEs). Accordingly, when a temperature is changed in a process of manufacturing the wafer level package 10, for example, the single molding member 20 included in the wafer level package 10 may shrink or expand at a room or high temperature, and thus, deformation of the substrate 40 such as bending may occur. Such deformation of the substrate 40 may be referred to as warpage. This will be described in detail with reference to FIG. 1C.

Referring to FIGS. 1B and 1C, a case where CTEs of the substrate 40 and the single molding member 20 that constitute the wafer level package 10 are different from each other, for example, a case where a CTE of the single molding member 20 is greater than a CTE of the substrate 40 is as follows: At a room temperature, the single molding member 20 having a greater CTE than that of the substrate 40 shrinks, and thus, a tensile stress may be exerted on the substrate 40. This may cause the substrate 40 to warp such that the substrate 40 is bent downward at a center thereof as shown in (1) of FIG. 1C. At a high temperature, the single molding member 20 having a greater CTE than that of the substrate 40 expands, and thus, a compressive stress may be exerted on the substrate 40. This may cause the substrate 40 to warp such that the substrate 40 is bent upwards at a center thereof as shown in (2) of FIG. 1C. In other words, the substrate 40 may become uneven, and a height difference H1A between the center and an end of the substrate 40 is generated at a room temperature and a height difference H1B between the center and an end of the substrate 40 is generated at a high temperature, due to warpage of the wafer level package 10.

On the contrary, a case where a CTE of the single molding member 20 is smaller than a CTE of the substrate 40 is as follows: At a room temperature, the single molding member 20 having a smaller CTE than that of the substrate 40 expands, and thus, a compressive stress may be exerted on the substrate 40. This may cause the substrate 40 to warp such that the substrate 40 is bent downward at a center thereof as shown in (2) of FIG. 1C. At a high temperature, the single molding member 20 having a smaller CTE than that of the substrate 40 shrinks, and thus, a tensile stress may be exerted on the substrate 40. This may cause the substrate 40 to warp such that the substrate 40 is bent upward at a center thereof as shown in (1) of FIG. 1C. In other words, the substrate 40 may become uneven, and the height difference H1B between the center and an end of the substrate 40 may be generated at a room temperature and the height difference H1A between the center and an end of the substrate 40 may be generated at a high temperature, due to warpage of the wafer level package 10.

As such, if a CTE of the single molding member 20 is different from a CTE of the substrate 40, when the substrate 40 is vacuum-chucked in a package manufacturing apparatus, the substrate 40 may not be accurately installed in the package manufacturing apparatus and the substrate 40 may not be fixed in a desired location, thereby causing work failure or a process loss in the package processing process.

Figure 2A:
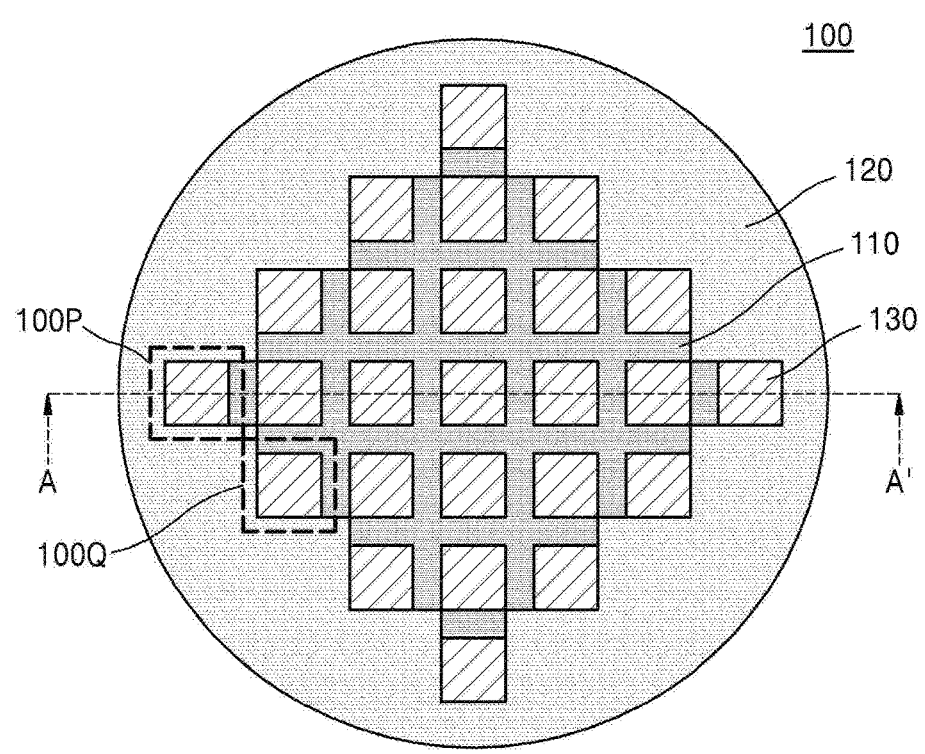
FIGS. 2A through 2C illustrate diagrams showing a wafer level package that includes dissimilar molding members according to an example embodiment.
Figure 2B:
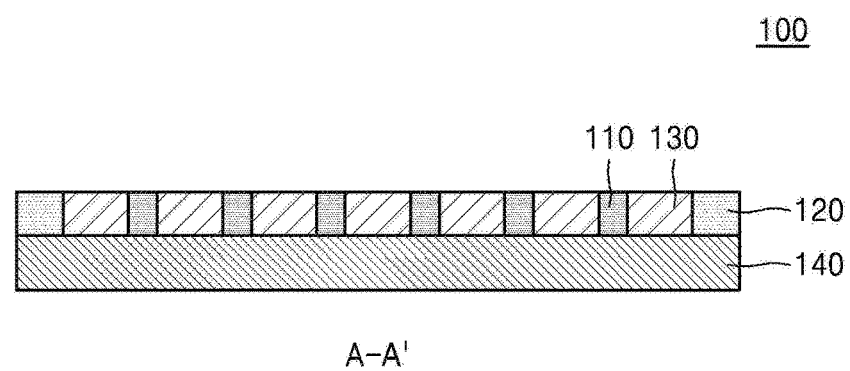
Figure 2C:
Figure 2C:

FIGS. 2A through 2C illustrate diagrams showing a wafer level package 100 that include dissimilar molding members according to an example embodiment. FIG. 2A is a plan view of the wafer level package 100. FIG. 2B, is a cross-sectional view of the wafer level package 100, which is taken along line A-A'. FIG. 2C shows a mimetic diagram showing warpage of the wafer level package 100.

Referring to FIG. 2A, the wafer level package 100 may be manufactured by using the dissimilar molding members. The water level package 100 may include a plurality of semiconductor chips 130 mounted on a substrate 140 (shown in FIG. 2B), and the molding members formed on the substrate 140 to contact the substrate 140 (shown in FIG. 2B) and the plurality of semiconductor chips 130. The molding members may include at least two parts which have CTEs different from each other. For example, the molding member may include a first molding member 110 and a second molding member 120 which have CTEs different from each other. The molding members may be manufactured so that the first molding member 110 is formed in an area located between the semiconductor chips 130 adjacent to each other (e.g., in an area in which the plurality of semiconductor chips face each other), and the second molding member 120 is formed in an outer area of the whole plurality of semiconductor chips 130 (e.g., in an area in which the plurality of semiconductor chips do not face each other). In other words, the plurality of semiconductor chips 130 may be disposed mainly in a center area of the substrate 140 (shown in FIG. 2B), and the plurality of semiconductor chips 130 may not be disposed in an outer area (or a peripheral region) of the substrate 140 (shown in FIG. 2B). The first molding member 110 may be formed mainly in the center area of the substrate 140 (shown in FIG. 2B), and the second molding member 120 may be disposed in the outer area of the substrate 140 (shown in FIG. 2B).

A whole top surface of the substrate 140 (shown in FIG. 2B) may be covered with the plurality of semiconductor chips 130, the first molding member 110, and the second molding member 120. A CTE of the first molding member 110 may be different from a CTE of the second molding member 120. In other words, the CTE of the first molding member 110 may be greater or smaller than the CTE of the second molding member 120.

Additionally, the CTE of the first molding member 110 may be greater than a CTE of the substrate 140 (shown in FIG. 2B), and the CTE of the substrate 140 (shown in FIG. 2B) may be greater than the CTE of the second molding member 120.

On the contrary, the CTE of the second molding member 120 may be greater than the CTE of the substrate 140 (shown in FIG. 2B), and the CTE of the substrate 140 (shown in FIG. 2B) may be greater than the CTE of the first molding member 110.

The substrate 140 (shown in FIG. 2B) may include a silicon wafer. The silicon wafer may have a CTE of about 7.6 ppm/K. About 800 to 1,200 semiconductor chips may be mounted on the silicon wafer, and the silicon wafer may have a diameter of about 300 mm. Additionally, the substrate 140 (shown in FIG. 2B) may include a semiconductor material such as germanium (Ge), or a compound semiconductor such as silicon carbide (SiC), gallium arsenide (GaAs), indium arsenide (InAs), or indium phosphide (InP).

The plurality of semiconductor chips 130 may include an integrated circuit. For example, the integrated circuit may include a memory circuit or a logic circuit. Additionally, the plurality of semiconductor chips 130 may include various types of a plurality of discrete devices. The plurality of discrete devices may include various microelectronic devices, for example, metal-oxide semiconductor field effect (MOSFET) such as a complementary metal oxide semiconductor (CMOS) transistor, a system large-scale integration (LSI), an image sensor such as a CMOS imaging sensor (CIS), a microelectromechanical system (MEMS), an active device, a passive device, or the like.

The wafer level package 100 may be cut and divided into semiconductor packages each including one semiconductor chip 130. Semiconductor packages 100P and 100Q illustrate examples of semiconductor packages including both the first molding member 110 and the second molding member 120 and will be described in detail with reference to FIGS. 8A and 8C.

Referring to FIG. 2B, the wafer level package 100 includes the plurality of semiconductor chips 130 mounted on the substrate 140, and the first molding member 110 and the second molding member 120 that are at a same level as that of top surfaces of the plurality of semiconductor chips 30. In a case where the wafer level package 100 has such a structure, since a material of the substrate 140, a material of the plurality of semiconductor chips 130, a material of the first molding member 110, and a material of the second molding member 120 are different from each other, the substrate 140, the plurality of semiconductor chips 130, the first molding member 110, and the second molding member 120 have different CTEs from each other. Accordingly, when a temperature is changed in a process of manufacturing the wafer level package 100, the first molding member 110 and the second molding member 120 included in the wafer level package 100 may shrink or expand at a room or high temperature, and thus, deformation of the substrate 140 such as bending may occur.

Various types of criteria for selecting a molding member in a general wafer level package process may be present. According to example embodiments, an appropriate first molding member 110 and an appropriate second molding member 120 may be selected by using a difference between CTEs of the substrate 140, the first molding member 110, and the second molding member 120, so as to reduce warpage of the wafer level package 100.

The first molding member 110 and the second molding member 120 may cover sides of the plurality of semiconductor chips 130, and expose top surfaces of the plurality of semiconductor chips 130. Here, the top surfaces of the plurality of semiconductor chips 130 may be opposite to surfaces (e.g., bottom surfaces) of the plurality of semiconductor chips 130 which contact the substrate 140 and may be inactive surfaces. The surfaces of the plurality of semiconductor chips 130 which contact the substrate 140 may be active surfaces. Alternatively, the top surfaces of the plurality of semiconductor chips 130 may be active surfaces, and the surfaces of the plurality of semiconductor chips 130 which contact the substrate 140 may be inactive surfaces. The first molding member 110 and the second molding member 120 may cover all the sides of the plurality of semiconductor 130. In other words, the whole sides of the plurality semiconductor chips 130 may be covered with the first molding member 110 and the second molding member 120. The top surfaces of the first molding member 110 and the second molding member 120 may be at a same level as those of the plurality of semiconductor chips 130 with respect to a top surface of the substrate 140.

The first molding member 110 or the second molding member 120 may be formed of, for example, an epoxy mold compound (EMC), resin, or the like. The first molding member 110 or the second molding member 120 may have a Young's modulus less than 1 Gpa, for example, tens to hundreds of MPa. The first molding member 110 or the second molding member 120 may be formed of, for example, a silicon-based material, a thermosetting material, an ultraviolet (UV)-processing material, or the like. The thermosetting material may include a hardening agent of a phenol type, an acid anhydride type, or an amine type, or an additive agent such as acrylic polymer.

Additionally, when the first molding member 100 or the second molding member 120 is formed of resin, the first molding member 110 or the second molding member 120 may contain a filler. The filler may be a silica filler.

Referring to FIGS. 2B and 2C, a case where CTEs of the substrate 140, the first molding member 110, and the second molding member 120 that constitute the wafer level package 100 are different from each other, for example, a case where the CTE of the first molding member 110 is greater than the CTE of the substrate 140 and the CTE of the substrate 140 is greater than the CTE of the second molding 120 is as follows: At a room temperature, the first molding member 110 having the CTE greater than that of the second molding member 120 shrinks, the second molding member 120 having the CTE smaller than that of the first molding member 110 expands, and thus, a tensile stress and a compressive stress are exerted on the substrate 140 at a same time. Accordingly, warpage may be generated in the substrate 140 in a form of a wave having a plurality of points of inflection as shown in (1) of FIG. 2C. At a high temperature, the first molding member 110 having the CTE greater than that of the second molding member 120 expands, the second molding member 120 having the CTE smaller than that of the first molding member 110 shrinks, and thus, a tensile stress and a compressive stress are exerted on the substrate 40 at a same time. Accordingly, warpage may be generated on the substrate 140 in a form of a wave having a plurality of points of inflection as shown in (2) of FIG. 2C, in a direction reverse to that shown in (1) of FIG. 2C. In other words, the substrate 140 may become uneven, and a height difference H2A between the center and an end of the substrate 140 is generated at a room temperature and a height difference H2B between the center and an end of the substrate 140 is generated at a high temperature due to warpage of the wafer level package 100. The height differences H2A and H2B are smaller than the height difference H1A and H1B shown in FIG. 1C.

On the contrary, a case where the CTE of the second molding member 120 is greater than the CTE of the substrate 140 and the CTE of the substrate 140 is greater than the CTE of the first molding member 110 is as follows: At a room temperature, the second molding member 120 having the CTE greater than that of the first molding member 110 shrinks and the first molding member 110 having the CTE smaller than that of the second molding member 120 expands, and thus, a tensile stress and a compressive stress are exerted on the substrate 140 at a same time. Thus, warpage may be generated on the substrate 140 in a form of a wave having a plurality of points of inflection as shown in (2) of FIG. 2C. At a high temperature, the second molding member 120 having the CTE greater than that of the first molding member 110 expands, the first molding member 110 having the CTE smaller than that of the second molding member 120 shrinks, and thus, a tensile stress and a compressive stress are exerted on the substrate 140 at a same time. Accordingly, warpage may be generated on the substrate 140 in a form of a wave having a plurality of points of inflection as shown in (1) of FIG. 2C, in a direction reverse to that shown in (2) of FIG. 2C. In other words, due to warpage of the wafer level package 100, the substrate 140 may become uneven, and the height difference H2B between the center and an end of the substrate 140 is generated at a room temperature and the height difference H2A between the center and ends of the substrate 40 is generated at a high temperature. The height differences H2A and H2B are smaller than the height difference H1A and H1B shown in FIG. 1C.

Accordingly, according to an example embodiment, when the substrate 140 included in the wafer level package 100 that includes dissimilar molding members is vacuum-chucked in a package manufacturing apparatus, the substrate 140 may be accurately fixed at a desired location in the package manufacturing apparatus, thereby reducing work failure or a process loss in the package processing process, compared to the wafer level package 10 described with reference to FIGS. 1A through 1C according to the comparative experimental example.

Although not shown, according to an example embodiment, molding members included in a wafer level package may include three or more types of members having CTEs different from each other. A height difference that may be caused by warpage may be reduced or minimized by effectively controlling a tensile stress and a compressive stress exerted on a substrate, based on differences in CTEs of the molding members and the substrate.

Figure 3A:
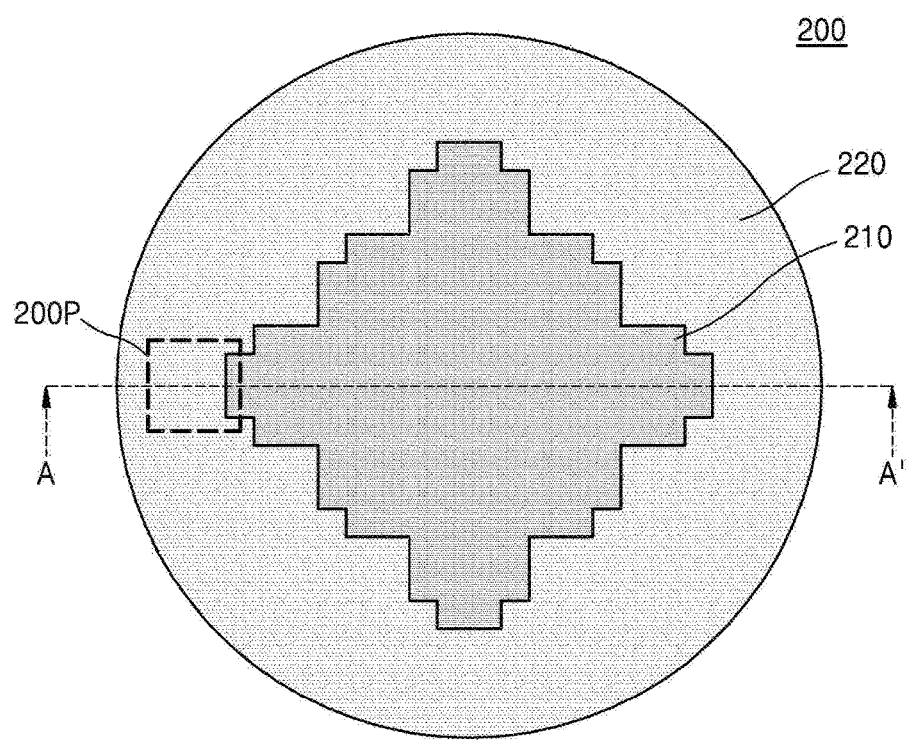
FIGS. 3A and 3B illustrate diagrams showing a wafer level package that includes dissimilar molding members according to an example embodiment.
Figure 3B:
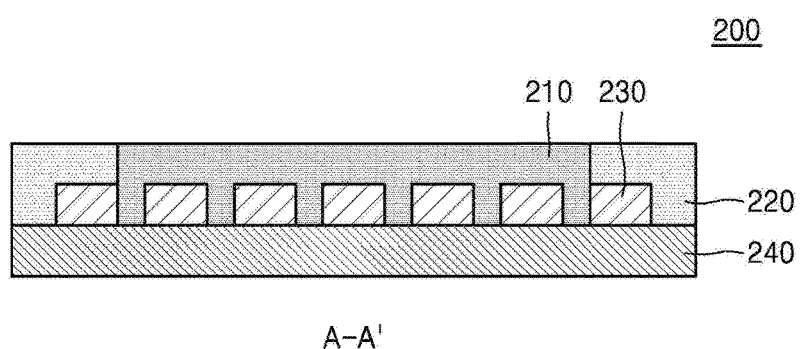

FIGS. 3A and 3B illustrate diagrams showing a wafer level package 200 that includes dissimilar molding members according to an example embodiment. FIG. 3A is a plan view of the wafer level package 200. FIG. 3B is a cross-sectional view of the wafer level package 200, which is taken along line A-A' of FIG. 3A. Referring to FIG. 3A, the wafer level package 200 may be manufactured by using dissimilar molding members. The wafer level package 200 may include a plurality of semiconductor chips 230 (shown in FIG. 3B) mounted on a substrate 240 (shown in FIG. 3B), and molding members that are formed on the substrate 240 (shown in FIG. 3B) to contact the substrate 240 (shown in FIG. 3B) and the plurality of semiconductor chips 230 (shown in FIG. 3B). The molding members may include at least two parts having CTEs different from each other. For example, the molding members may include a first molding member 210 and a second molding member 220 having CTEs different from each other. The molding members may be manufactured so that the first molding member 210 (shown in FIG. 3B) are formed in an area located between the plurality of semiconductor chips 230 (shown in FIG. 3B) adjacent to each other, and the second molding member 220 is formed in an outer area of the whole plurality of semiconductor chips 230 (shown in FIG. 3B). A whole top surface of the substrate 240 (shown in FIG. 3B) is covered with the plurality of semiconductor chips 230 (shown in FIG. 3B), the first molding member 210, and the second molding member 220. The first molding member 210 and the second molding member 220 may cover top surfaces of the plurality of semiconductor chips 230 (shown in FIG. 3B). In other words, top surfaces of the first molding member 210 and the second molding member 220 may be at a higher level than the top surfaces of the plurality of semiconductor chips 230 (shown in FIG. 3B) with respect to the top surface of the substrate 240 (shown in FIG. 3B). The whole wafer level package 200 is covered with the first molding member 210 and the second molding member 220. Additionally, CTEs of the first molding member 210 and the second molding member 220 may be different from each other.

The wafer level package 200 may be cut and divided into semiconductor packages each including one semiconductor chip 230. A Semiconductor package 200P illustrates an example of a semiconductor package including both the first molding member 210 and the second molding member 220 and will be described in detail with reference to FIGS. 9A and 9B.

Referring to FIG. 3B, the wafer level package 200 includes the plurality of semiconductor chips 230 mounted on the substrate 240, and the first molding member 210 and the second molding member 220 that are at a higher level than top surfaces of the plurality of semiconductor chips 230. Characteristics of the substrate 240, the first molding member 210, and the second molding member 220 with respect to a difference between CTEs thereof were described above, and thus, a description about the characteristics is not provided here again.

Figure 4A:
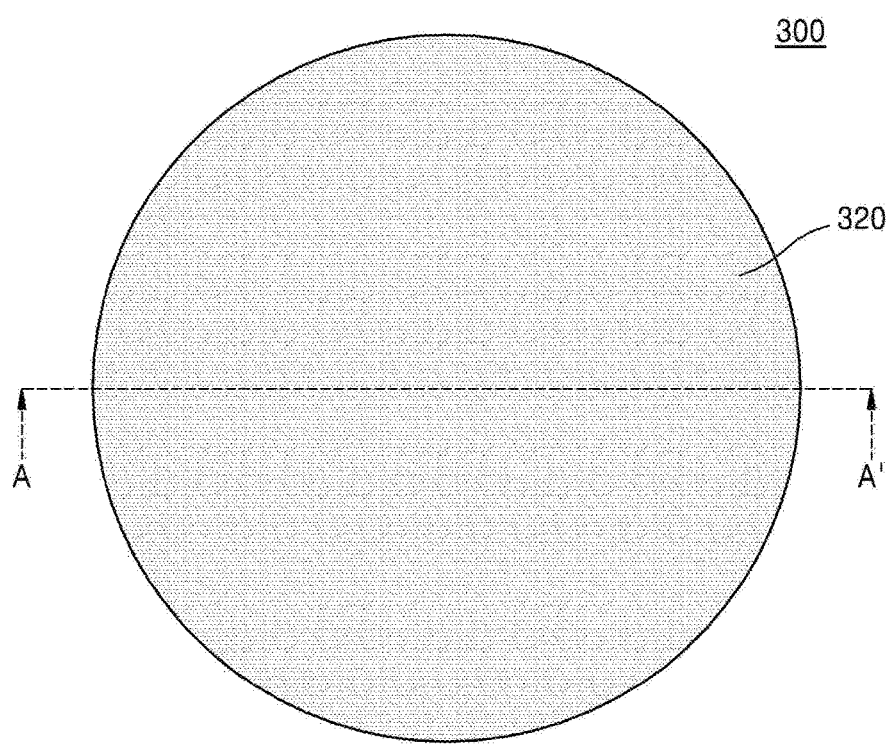
FIGS. 4A and 4B illustrate diagrams showing a wafer level package that includes dissimilar molding members according to an example embodiment.
Figure 4B:
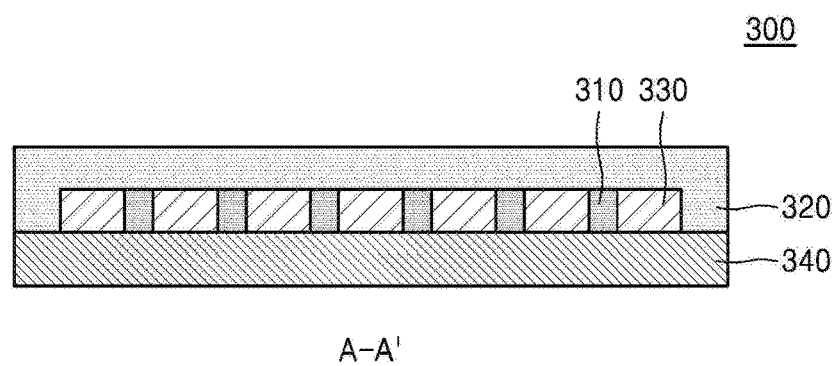

FIGS. 4A and 4B illustrate diagrams showing a wafer level package 300 that includes dissimilar molding members according to an example embodiment, FIG. 4A is a plan view of the wafer level package 300. FIG. 4B is a cross-sectional view of the wafer level package 300, which is taken along line A-A'.

Referring to FIG. 4A, the wafer level package 300 may be manufactured by using dissimilar molding members. The wafer level package 300 may include a plurality of semiconductor chips 330 (shown in FIG. 4B) mounted on a substrate 340 (shown in FIG. 4B), and molding members formed on the substrate 340 (shown in FIG. 4B) to contact the substrate 340 (shown in FIG. 4B) and the plurality of semiconductor chips 330 (shown in FIG. 4B). The molding members may consist of at least two parts having CTEs different from each other. For example, the molding members may include a first molding member 310 (shown in FIG. 4B) and a second molding member 320 having CTEs different from each other. The molding members may be manufactured so that the first molding member 310 (shown in FIG. 4B) is formed in an area located between the plurality of semiconductor chips 330 (shown in FIG. 4B) adjacent to each other, and the second molding member 320 is formed in an outer area of the whole plurality of semiconductor chips 330 (shown in FIG. 4B). A whole top surface of the substrate 340 (shown in FIG. 4B) is covered with the plurality of semiconductor chips 330 (shown in FIG. 4B), the first molding member 310 (shown in FIG. 4B), and the second molding member 320. The second molding member 320 may cover the top surfaces of the plurality of semiconductor chips 330 (shown in FIG. 4B). In other words, the top surface of the second molding member 320 may be at a higher level than the top surfaces of the plurality of semiconductor chips 330 (shown in FIG. 4B) with respect to the top surface of the substrate 340 (shown in FIG. 4B). Since the second molding member 320 covers all the top surfaces of the substrate 340 (shown in FIG. 4B), the plurality of semiconductor chips 330 (shown in FIG. 4B), and the first molding member 310 (shown in FIG. 4B), only the second molding member 320 may be present on the top surface of the wafer level package 330. Additionally, CTEs of the first molding member 310 (shown in FIG. 4B) and the second molding member 320 may be different from each other.

Referring to FIG. 4B, the wafer level package 300 includes the plurality of semiconductor chips 330 mounted on the substrate 340, and the first molding member 310 that is at a same level as the top surfaces of the plurality of semiconductor chips 330, and the second molding member 320 that is at a higher level than the top surfaces of the plurality of semiconductor chips 330 and the first molding member 310. Characteristics of the substrate 340, the first molding member 310, and the second molding member 320 with respect to a difference between CTEs thereof are the same as those described above, and thus, a description about the characteristics is not provided here again.

However, since the second molding member 320 is formed to cover the plurality of semiconductor chips 330 and the first molding member 310, a CTE of the substrate 340 and a CTE of the second molding member 320 may have a great effect on warpage of the whole wafer level package 300. The second molding member 320 included in the wafer level package 300 may affect the whole substrate 340.

Figure 5:
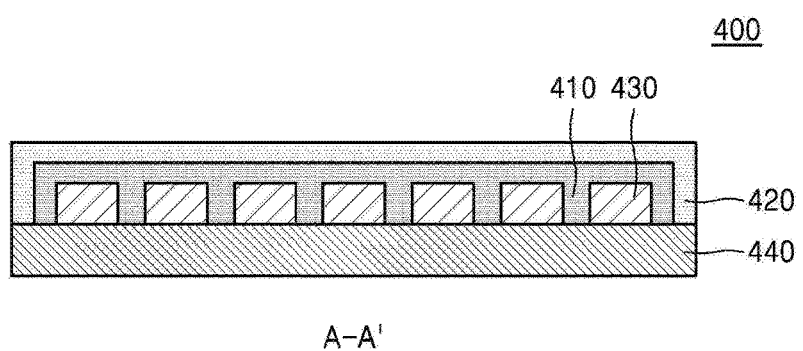
FIGS. 5 through 7 illustrate diagrams showing a wafer level package that includes dissimilar molding members according to an example embodiment.
Figure 6:
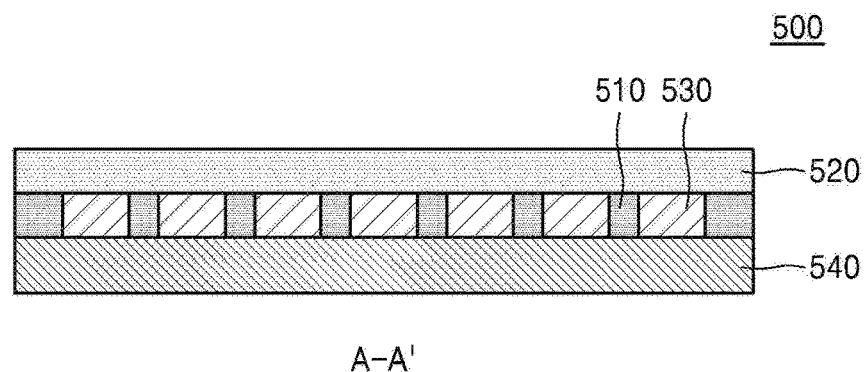
Figure 7:
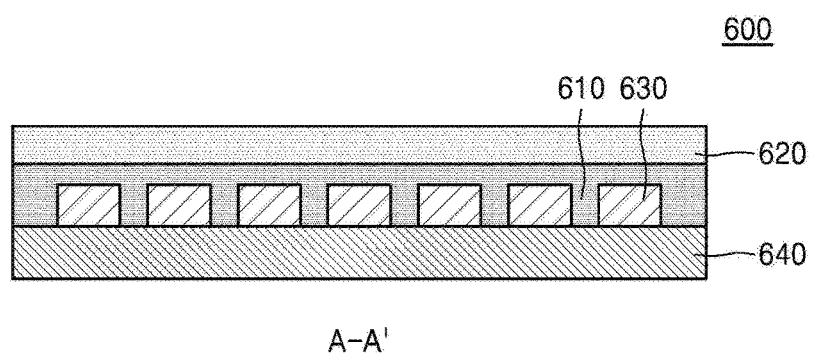

FIGS. 5 through 7 illustrate diagrams showing wafer level packages 400 through 600 that include dissimilar molding members according to an example embodiment.

Referring to FIG. 5, a top view of the wafer level package 400 may be identical to that of the wafer level package 300 shown in FIG. 4A, and molding members of the wafer level package 400 may include a first molding member 410 and a second molding member 420 that have CTEs different from each other as described with reference to FIG. 4B. In other words, a whole top surface of the wafer level package 400 may correspond to a top surface of the second molding member 420. Whole top surfaces and side surfaces of the plurality of semiconductor chips 430 may be covered with the first molding member 410. An area of the substrate 440 which is not covered with the first molding member 410, and the first molding member 410 may be covered with the second molding member 420. As described with reference to FIGS. 4A and 4B, the second molding member 420 may affect the whole substrate 440.

Referring to FIG. 6, a top view of a wafer level package 500 may be identical to that of the wafer level package 300 shown in FIG. 4A, and molding members may of wafer level package 500 may include a first molding member 510 and a second molding member 520 that have CTEs different from each other as described with reference to FIG. 4B. In other words, a whole top surface of the wafer level package 500 may correspond to a top surface of the second molding member 520. A level of top surfaces of the plurality of semiconductor chips 530 is identical to a level of a top surface of the first molding member 510. The plurality of semiconductor chips 530 and the first molding member 510 may cover a whole top surface of the substrate 540. Whole top surfaces of the plurality of semiconductor chips 530 and the whole top surface of the first molding member 510 may be covered with the second molding member 520. As described with reference to FIGS. 4A and 4B, the second molding member 520 may affect the whole substrate 540.

Referring to FIG. 7, a top view of a wafer level package 600 may be identical to that of the wafer level package 300 shown in FIG. 4A, and molding members of wafer level package 600 may include a first molding member 610 and a second molding member 620 that have CTEs different from each other as described with reference to FIG. 4B. In other words, a whole top surface of the wafer level package 600 may correspond to a top surface of the second molding member 620. Whole top surfaces and side surfaces of the plurality of semiconductor chips 630 may be covered with the first molding member 610. The plurality of semiconductor chips 630 and the first molding member 610 may cover a whole top surface of the substrate 640. A whole top surface of the first molding member 610 is covered with the second molding member 620. As described with reference to FIGS. 4A and 4B, the second molding member 620 may affect the whole substrate 640.

In the case of the wafer level packages 400 through 600 described with reference to FIGS. 5 through 7, molding members may be formed to reduce or minimize warpage. For example, the molding members may include the first molding members 410, 510, or 610, and the second molding member 420, 520, or 620 which have a different CTE from each other in various forms. In other words, since CTEs of the substrate 440, 540, or 640, the first molding member 410, 510, or 610, and the second molding member 420, 520, or 620 may have unique values according to a material thereof, a height difference of each of the wafer level packages 400, 500, and 600 that may be caused by generation of warpage may be reduced or minimized by manufacturing the substrate 440, 540, or 640, the first molding member 410, 510, or 610, and the second molding member 420, 520, or 620 in various modified shapes.

Figure 8A:
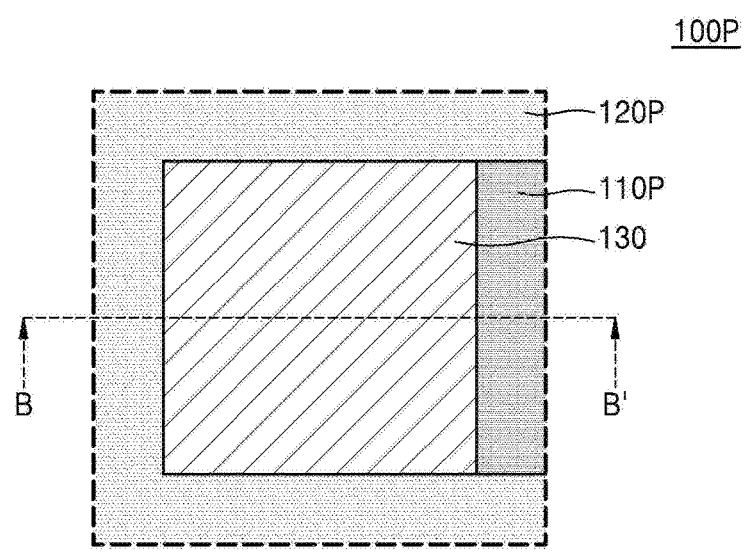
FIGS. 8A through 8C illustrate diagrams showing a wafer level package obtained after a wafer level package that includes dissimilar molding members is cut, according to an example embodiment.
Figure 8B:
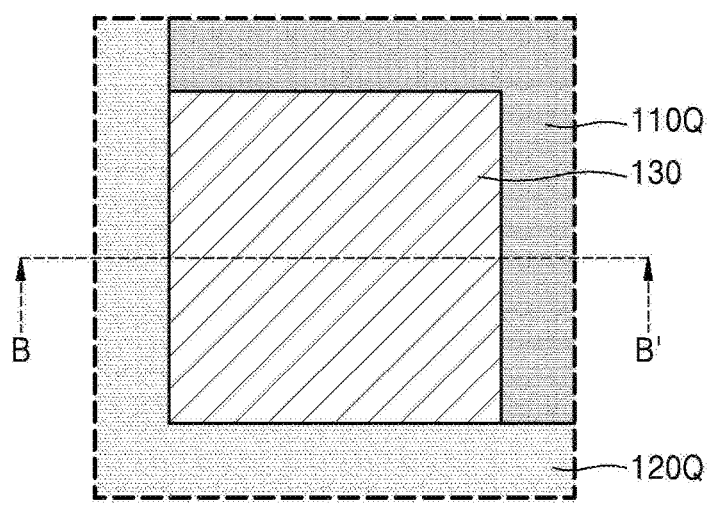
Figure 8C:
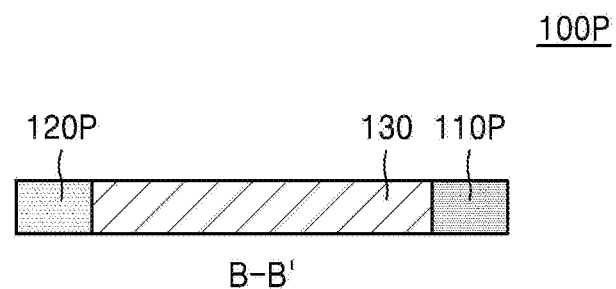

FIGS. 8A through 8C illustrate diagrams showing a wafer level package 100P or 100Q obtained after the wafer level package 100 (shown in FIG. 2A) that includes dissimilar molding members is cut, according to an example embodiment. FIGS. 8A and 8B are plan views of the wafer level package 100P and 100Q, respectively. FIG. 8C is a cross-sectional view of the wafer level package 100P, which is taken along line B-B'.

Referring to FIG. 8A the semiconductor package 100P may include the sides of which are surrounded by the first molding member 110 (shown in FIG. 2A) and the second molding member 120 (shown in FIG. 2A) may. The semiconductor package 100P may be manufactured from cutting the wafer level package 100 (shown in FIG. 2A), which includes the plurality of semiconductor chips 130 (shown in FIG. 2A) mounted on the substrate 140 (shown in FIG. 2A) along with the first molding member 110 (shown in FIG. 2A) and the second molding member 120 (shown in FIG. 2A) which cover sides of the plurality of the semiconductor chips 130 (shown in FIG. 2A). The cutting may be performed along a dicing line. The wafer level package 100 (shown in FIG. 2A), described with reference to FIG. 2A, may include the semiconductor package 110P (shown in FIG. 2A) that includes both the first molding member 110 (shown in FIG. 2A) and the second molding member 120 (shown in FIG. 2A) or a semiconductor package that includes only the second molding member 120 (shown in FIG. 2A), according to a relative position of the plurality of semiconductor chips 130 (shown in FIG. 2A).

According to example embodiments, a method of accurately chucking the substrate 140 (shown in FIG. 2A) in a package manufacturing apparatus before cutting the wafer level package 100 (shown in FIG. 2A) may be provided. After the wafer semiconductor package is cut in the shape of the semiconductor package 100P, an effect in which parts of molding members have on the semiconductor package 100P may be limited. The semiconductor package 100P may include a semiconductor chip 130, apart 110P of a first molding member which covers one side from among four sides of the semiconductor chip 130, and a part 120P of a second molding member that covers other three sides from among the four sides of the semiconductor chip 130.

Referring to FIG. 8B, the semiconductor package 100Q may include the sides of which are covered by the first molding member 110 (shown in FIG. 2A) and the second molding member 120 (shown in FIG. 2A). The semiconductor package 100Q may be manufactured from cutting the wafer level package 100 (shown in FIG. 2A), which includes the plurality of semiconductor chips 130 (shown in FIG. 2A) mounted on the substrate 140 (shown in FIG. 2A) along with the first molding member 110 (shown in FIG. 2A) and the second molding member 120 (shown in FIG. 2A) which covers sides of the plurality of chips 130 (shown in FIG. 2A).

According to an example embodiment, a method of accurately chucking the substrate 140 (shown in FIG. 2A) in a package manufacturing apparatus before cutting the wafer level package 100 (shown in FIG. 2A) may be provided. After the wafer semiconductor package 100 is cut in the shape of the semiconductor package 100Q, an effect that parts of molding members may have on the semiconductor package 100Q may be limited. The semiconductor package 100Q may include a semiconductor chip 130, a part 110Q of a first molding member which covers two adjacent sides from among four sides of the semiconductor chip 130, and a part 120Q of a second molding member which covers two remaining adjacent sides from among the four sides of the semiconductor chip 130.

The cross-sectional view of the wafer level package 100Q, which is taken along line B-B', may be identical to the cross-sectional view of the wafer level package 100P. Hereinafter, a description will be provided with reference to the wafer level package 100P.

Referring to FIG. 8C, the semiconductor package 100P may include a semiconductor chip 130, the part 110P of the first molding member that covers a side of the semiconductor chip 130 and is at a same level as a top surface and a bottom surface of the semiconductor chip 130, and the part 120P of the second molding member that covers another side of the semiconductor chip 130 and is at a same level as the top surface and the bottom surface of the semiconductor chip 130.

Here, the top surface and the bottom surface of the semiconductor chip 130 may not covered by the parts 110*p* and 120P of the molding members. The top surface of the semiconductor chip 130 may be a deactivated surface, and the bottom surface thereof may be an active surface, or vice versa.

Figure 9A:
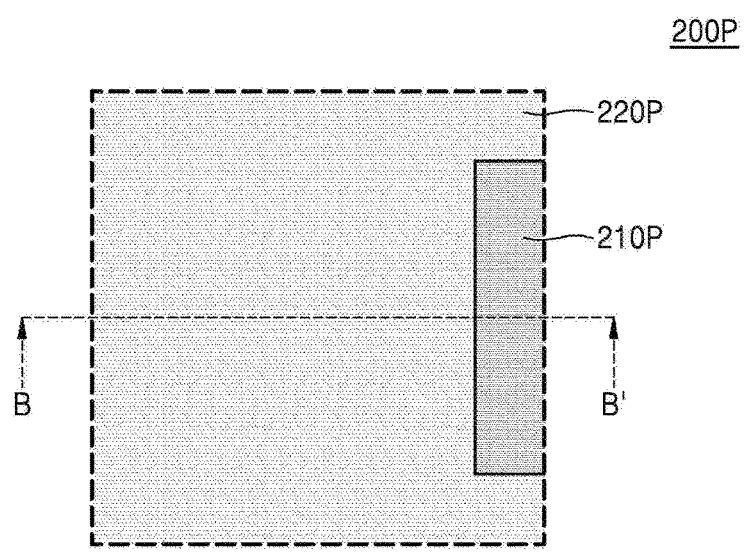
FIGS. 9A and 9B illustrate diagrams showing a wafer level package obtained after a wafer level package that includes dissimilar molding members is cut, according to an example embodiment.
Figure 9B:
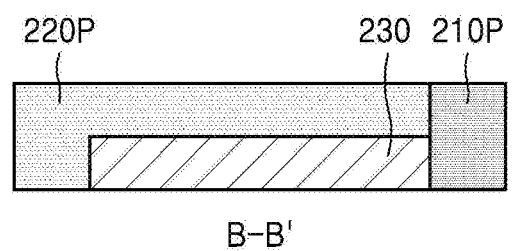

FIGS. 9A and 9B illustrate diagrams showing a wafer level package 200P obtained after the wafer level package 200 (shown in FIG. 3A) that includes dissimilar molding members is cut, according to an example embodiment. FIG. 9A is a plan view of a wafer level package 200P. FIG. 9B is a cross-sectional view of the wafer level package 200P, which is taken along line B-B'. Referring to FIG. 9A, the semiconductor package 200P may be manufactured from cutting the wafer level package 200 (shown in FIG. 3A), which includes the plurality of semiconductor chips 230 (shown in FIG. 3A) mounted on the substrate 240 (shown in FIG. 3A) along with the first molding member 210 (shown in FIG. 3A) and the second molding member 220 (shown in FIG. 3A) which covers sides of the plurality of chips 230 (shown in FIG. 3A). The cutting may be performed along a dicing line. Characteristics of the semiconductor package 200P may be identical to those provided with reference to the semiconductor package 100P. Thus, a description thereof will not be provided here again.

Referring to FIG. 9B, the semiconductor package 200P may include one semiconductor chip 230, a part 210P of a first molding member which covers a side of the semiconductor chip 230 and is at a higher level than a top surface of the semiconductor chip 230 and at a same level as a bottom surface of the semiconductor chip 230, and a part 220P of a second molding member which covers another side of the semiconductor chip 230 and is at a higher level than the top surface of the semiconductor chip 230 and at a same level as the bottom surface of the semiconductor chip 230.

Here, the bottom surface of the semiconductor chip 230 may be not covered with the parts 210*p* and 220P of the molding members. The top surface of the semiconductor chip 230 may be an inactive surface, and the bottom surface thereof may be an active surface.

Figure 10:
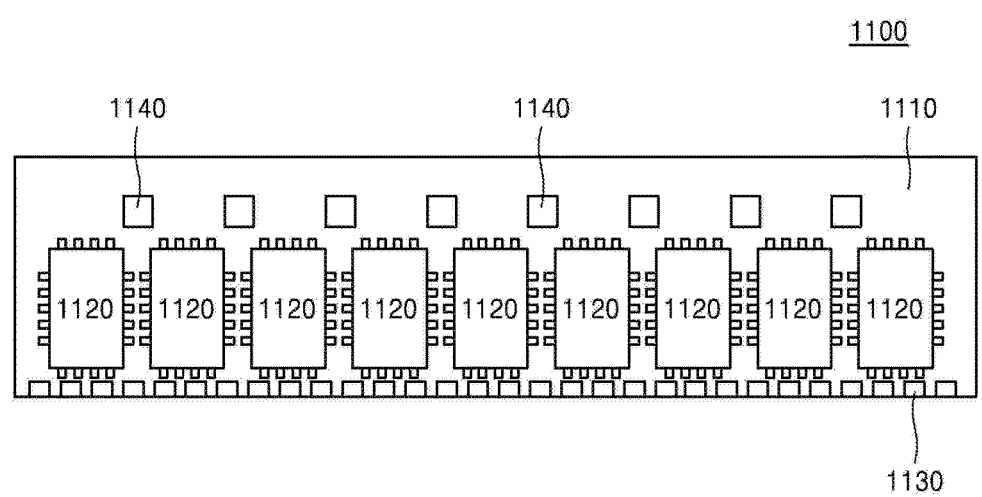
FIG. 10 illustrates a plan view of a memory module that includes a wafer level package according to an example embodiments.

FIG. 10 illustrates a plan view of a memory module 1100 that includes a wafer level package according to example embodiments.

Referring to FIG. 10, the memory module 1100 includes a module substrate 1110, and a plurality of semiconductor package 1120 attached to the module substrate 1110.

The semiconductor package 1120 includes a wafer level package according to example embodiments. For example, the plurality of semiconductor package 1120 may include the wafer level package shown in FIG. 2A through 9B.

A connection unit 1130 that may be inserted into a socket of a mainboard is disposed at a side of the module substrate 1110. A ceramic decoupling capacitor 1140 is disposed on the module substrate 1110. According to an example embodiment, the memory module 1100 is not limited to a configuration shown in FIG. 10, and may be manufactured in various forms.

Figure 11:
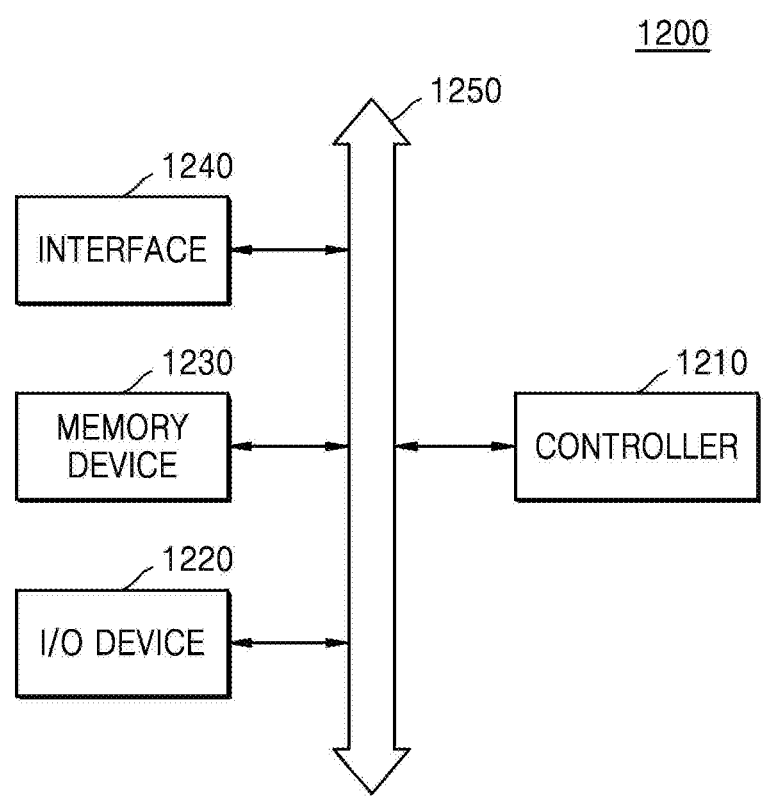
FIG. 11 illustrates a block diagram of a system that includes a wafer level package according to example embodiments.

FIG. 11 illustrates a block diagram of a system 1200 that includes a wafer level package according to example embodiments.

Referring to FIG. 11, the system 1200 includes a controller 1210, an input/output device 1220, a memory device 1230, and an interface 1240. The system 1220 may be a mobile system or a system for transmitting or receiving information. According to some example embodiments, the mobile system is a personal digital assistant (PDA), a portable computer, a web tablet, a wireless phone, a mobile phone, a digital music player, or a memory card. The controller 1210 controls an execution program in the system 1200, and may include a microprocessor, a digital signal processor, a microcontroller, or other similar devices. The input/output device 1220 may be used to input or output data in the system 1200. The system 1200 may be connected to an external device, for example, a personal computer or a network by using the input/output device 1220, and exchange data with the external device. The input/output device 1220 may be a keypad, a keyboard, or a display device.

The memory device 1230 may store a code and/or data for operating the controller 1210, or store data processed by the controller 1210. According to an example embodiment, the memory device 1230 includes a wafer level package. For example, the semiconductor package may include the wafer level package shown in FIG. 2A through 9B.

The interface 1240 may be a data transmission path between the system 1200 and an external device. The controller 1210, the input/output device 1220, the memory device 1230, and the interface 1240 may communicate with each other via a bus 1250. The system 1200 may be used for a mobile phone, a moving pictures expert group audio layer 3 (MP3) player, a navigation device, a portable multimedia player (PMP), a solid-state disk (SSD), or a household appliances.

Figure 12:
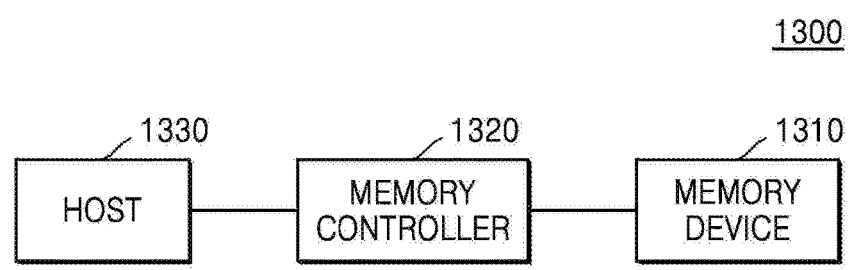
FIG. 12 illustrates a block diagram of a memory card that includes a wafer level package according to example embodiments.

FIG. 12 illustrates a block diagram of a memory card 1300 that includes a wafer level package according to example embodiments.

Referring to FIG. 12, the memory card 1300 includes a memory device 1310 and a memory controller 1320.

The memory device 1310 may store data. According to some example embodiments, the memory device 1310 has non-volatile characteristics that stored data may be maintained even when power supply is stopped. According to an example embodiment, the memory device 1310 includes a wafer level package. For example, the memory device 1310 may include the wafer level package shown in FIG. 2A through 9B.

The memory controller 1320 may read data stored in the memory device 1310 or store data in the memory 1310 in response to a read/write request from a host 1330.

While the inventive concepts has been particularly shown and described with reference to example embodiments thereof, it will be understood that various changes in form and details may be made therein without departing from the spirit and scope of the following claims.

What is claimed is:

1. A wafer level package comprising:
a substrate;
a plurality of semiconductor chips mounted on the substrate; and
molding members on the substrate, the molding members contacting the substrate and the plurality of semiconductor chips,
wherein the molding members include a first molding member and a second molding member, a coefficient of thermal expansion (CTE) of one of the first molding member and the second molding member is greater than a CTE of the substrate, and a CTE of the other of the first molding member and the second molding member is less than the CTE of the substrate,
at least one of the plurality of semiconductor chips is surrounded only by the first molding member, and
remaining ones of the plurality of semiconductor chips are surrounded by the first molding member and the second molding member.

2. The wafer level package of claim 1, wherein top surfaces of the molding members are at a same level as top surfaces of the plurality of semiconductor chips with respect to a top surface of the substrate, and the molding members expose the top surfaces of the plurality of semiconductor chips.

3. The wafer level package of claim 1, wherein top surfaces of the molding members are at a higher level than top surfaces of the plurality of semiconductor chips with respect to a top surface of the substrate, and the molding members cover the top surfaces of the plurality of semiconductor chips.

4. The wafer level package of claim 1, wherein
the first molding member surrounds at least sides of the plurality of semiconductor chips, and
the second molding member surrounds the first molding member.

5. The wafer level package of claim 4, wherein a top surface of the first molding member is at a same level as top surfaces of the plurality of semiconductor chips with respect to a top surface of the substrate.

6. The wafer level package of claim 4, wherein the first molding member covers the plurality of semiconductor chips.

7. The wafer level package of claim 1, wherein the substrate is warped in a form of a wave.

8. A wafer level package comprising:
a semiconductor chip having a top surface, a bottom surface, and at least four sides;
a first molding member that covers at least one side of the semiconductor chip; and
a second molding member that covers sides of the semiconductor chip which are not covered with the first molding member,
wherein coefficients of thermal expansion (CTEs) of the first molding member and the second molding member are different from each other.

9. The wafer level package of claim 8, wherein
the first molding member covers one side from among the at least four sides of the semiconductor chip, and
the second molding member covers the sides of the semiconductor chip which are not covered with the first molding member.

10. The wafer level package of claim 8, wherein
the first molding member covers two adjacent sides from among the at least four sides of the semiconductor chip, and
the second molding member covers the sides of the semiconductor chip which are not covered with the first molding member.

11. The wafer level package of claim 8, wherein
the first molding member and the second molding member cover the at least four sides of the semiconductor chip, and
the top surface and the bottom surface of the semiconductor chip are not covered with the first molding member and the second molding member.

12. The wafer level package of claim 8, wherein
the first molding member and the second molding member cover the at least four sides of the semiconductor chip,
the first molding member or the second molding member covers the top surface of the semiconductor chip, and
the bottom surface of the semiconductor chip is not covered with the first molding member and the second molding member.

13. A wafer level package comprising:
a substrate;
a plurality of semiconductor chips mounted on the substrate; and
a first molding member formed in an area in which the plurality of semiconductor chips face each other; and
a second molding member formed in an area in which the plurality of semiconductor chips do not face each other,
wherein a coefficient of thermal expansion (CTE) of one of the first molding member and the second molding member is greater than a CTE of the substrate, and a CTE of the other of the first molding member and the second molding member is less than the CTE of the substrate, and
a top surface of the first molding member is at a same level as top surfaces of the plurality of semiconductor chips with respect to a top surface of the substrate.

14. The wafer level package of claim 13, wherein a top surface of the first molding member, a top surface of the second molding member, and top surfaces of the plurality of semiconductor chips are at a same level with respect to a top surface of the substrate, and the molding members expose the top surfaces of the plurality of semiconductor chips.

15. The wafer level package of claim 13, wherein
at least one of the plurality of semiconductor chips contacts both the first molding member and the second molding member, and remaining ones of the plurality of semiconductor chips contact only the first molding member.

\* \* \* \* \*